United States Patent [19]

Iten

[11] Patent Number: 4,857,887
[45] Date of Patent: Aug. 15, 1989

[54] LAMINATED PIEZOELECTRIC KEYBOARD

[75] Inventor: Thomas Iten, Zug, Switzerland

[73] Assignee: Schenk & Co., Switzerland

[21] Appl. No.: 253,436

[22] Filed: Oct. 5, 1988

Related U.S. Application Data

[63] Continuation of Ser. No. 887,784, Jul. 21, 1986, abandoned.

[30] Foreign Application Priority Data

Jul. 23, 1985 [CH] Switzerland ............... 03191/85

[51] Int. Cl.$^4$ ............................................. H01H 3/12
[52] U.S. Cl. .................................. 341/34; 200/5 A;
200/512; 310/340
[58] Field of Search ............. 340/365 A, 365 R;
310/339, 338, 340; 200/5 R, 5 A, 159 B

[56] References Cited

U.S. PATENT DOCUMENTS

| | | | |
|---|---|---|---|
| 3,339,104 | 8/1967 | Kushner et al. | 310/339 |
| 3,464,531 | 9/1969 | Herr et al. | 340/365 A |
| 3,940,637 | 2/1976 | Ohigashi et al. | 310/339 |
| 4,190,785 | 2/1980 | Kompanek | 340/365 P |
| 4,207,443 | 6/1980 | Matsuura | 200/5 A |
| 4,375,018 | 2/1983 | Peterson | 200/5 A |
| 4,431,882 | 2/1984 | Frame | 200/159 B |
| 4,618,797 | 10/1986 | Cline | 310/339 |
| 4,680,432 | 7/1987 | Sugiyama et al. | 200/159 B |

FOREIGN PATENT DOCUMENTS 0107318 9/1983 European Pat. Off. .
2455402 4/1980 France .

OTHER PUBLICATIONS

Randeraat, "Piezoelectric Ceramics", Mullard Limited, London, pp. 4–8, 47 and 52.

Primary Examiner—John W. Caldwell, Sr.
Assistant Examiner—Alvin Oberley
Attorney, Agent, or Firm—Barnes & Thornburg

[57] ABSTRACT

The keyboard comprises piezoelectric crystal elements arranged between laminates provided with conducting strips. A voltage is generated when pressure is applied to the elements. The keyboard is tensionless in its rest state and contains no unwanted air spaces.

10 Claims, 2 Drawing Sheets

LAMINATED PIEZOELECTRIC KEYBOARD

BACKGROUND OF THE INVENTION

This application is a continuation of application Ser. No. 887,784, filed July 21, 1986, now abandoned.

The invention relates to a keyboard with laminate construction.

DESCRIPTION OF THE PRIOR ART

Laminated keyboards, also known as flexible membrane keyboards, usually show a laminate construction with two laminates or sheets, respectively, which are each provided with electrically conducting key areas. The key areas or contacts, respectively, are opposing each other and are separated by a space containing air. When finger pressure is applied to one of the keys, the upper sheet is deformed until contact is made with the corresponding conducting area on the lower sheet. Since the key contact is thus moved and stressed with each actuation of the key, signs of fatigue may show after a certain time, affecting contact reliability. The air trapped in the contact separating space may promote oxidation of the contacts and may, under high ambient temperature or at low ambient pressure (e.g. at high altitude), expand to an extent that the operation of the keyboard is affected or the keyboard is even damaged. These passively operating membrane keyboards switch an externally applied voltage which is thus permanently present on the printed conductors of the keyboard and which may cause electrolytic effects and oxidation, reducing the lifespan of the keyboard.

From EP-A 0 107 318 a keyboard is known using piezoelectric crystals as signal generators. This keyboard is not a laminated keyboard, but single piezoelectric crystals are mounted at the underside of a rigid housing where several in-between layers are arranged between each crystal and the housing.

From U.S. Pat. No. 4,190,785 another rigid piezoelectric keyboard is known having a continuous piezoelectric plating at the underside of a rigid plate. Such an arrangement may show considerable cross-talk between the keys.

From FR-A-2 455 402 a keyboard is known having special elements of rubber being conductive under pressure.

SUMMARY OF THE INVENTION

It is an object of the present invention to provide a keyboard with laminate construction which avoids the disadvantages mentioned above.

This invention accordingly provides a keyboard comprising a laminate or a rigid plate forming a support, at least one cover laminate and at least one piezoelectric crystal element arranged between said support laminate and said cover laminate, which element emits or alters an electrical signal upon application of pressure. By arranging pressure sensitive crystal elements between the laminates, disturbing air spaces can be mostly avoided and the keys can be actuated almost without travel. Since the crystal elements generate a voltage when pressure is exerted, an externally applied voltage is not necessary and hence the keyboard is tensionless when not operated.

BRIEF DESCRIPTION OF THE DRAWINGS

The mentioned and other objects and advantages of this invention will be apparent from the following detailed descriptions of the specification and accompaning drawings.

DESCRIPTION OF THE PREFERRED EMBODIMENTS

Figure 1:
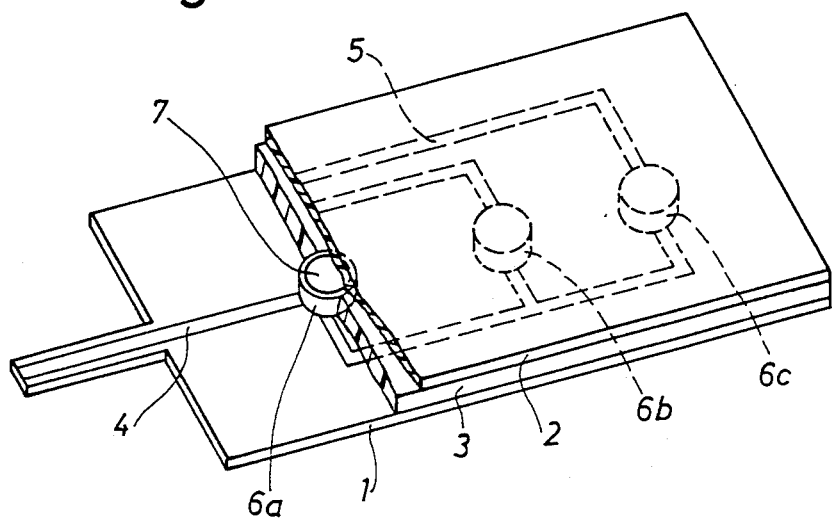
FIG. 1 is a perspective view of an embodiment of the inventive keyboard, wherein parts of the laminates have been omitted.

FIG. 1 shows a laminated keyboard having three keys, with laminates 1, 2, 3 and crystal elements 6a,b,c. Some of the laminates are only partly shown for better representation. The first laminate 1 forms a support for the other parts of the keyboard and can be made from known plastic materials such as polyethylene, polyester or polycarbonate. The thickness of laminate 1 is shown enlarged in FIG. 1 for better graphic representation; for a typical laminated keyboard this thickness is approximately 0.1 mm, but the thickness can be selected within a wide range. Thus, in place of foil 1 a rigid plate of whatever thickness can be used. Crystal elements 6a, 6b, 6c are supported by the laminate and arranged at those places where a key is wanted. A cover laminate 2 is arranged above the crystal elements and is glued to laminate 1; suitable glues are commercially available. In the shown preferred embodiment another laminate 3 is arranged between support laminate 1 and cover laminate 2. Laminate 3 is provided with a recess at each key area and its thickness corresponds essentially to the thickness of the crystal elements and the associated conducting layers. In this way a uniform flat keyboard surface is attained, which is preferred in most cases. Laminates 1, 2 and 3 are glued together, whereby no glue is provided for at the crystal element areas; therefore, electrical contact will not be affected by the glue. The thickness of cover laminate 2 is also shown enlarged in FIG. 1 and is typically approximately 0.1 mm. The thickness of the cover laminate 2 can be varied within a wide range, too, as long as the pressure transmission to the element is assured. The thickness of laminate 3 is chosen according to the crystal elements, e.g. as 0.4 mm; this laminate is also made from a known plastic material. For a keyboard to be operated by human fingers, the diameter of the crystal elements is approximately 10 mm, but can be chosen within a wide range according to the field of use of the keyboard or according to the crystal material. Suitable crystal elements are commercially available from different manufacturers.

The position of the crystal elements defines the key areas of the keyboard. When pressure is applied to the cover laminate 2 above one of the crystal elements, then a voltage is generated by this element, which is taken from the element and fed to a terminal of the keyboard as will be described below in greater detail.

All piezoelectric crystal or ceramic materials can be used as crystal elements, such as quartz, bariumtitanate, lead zircon titanate or other known materials with piezoelectric properties. Also silicon crystals can be used. Further, the different materials can be combined. For increasing the generated voltage when pressure is applied, several elements can be piled, although this increases the thickness of the keyboard. In a preferred embodiment one or several of the crystal elements include an additional amplifier or logic circuit. To this end, commercially available integrated circuits are arranged between the laminates together with the pressure sensitive crystal. These circuits may be adapted for detecting key strokes, for matching the key voltage levels to selected levels, such as CMOS-levels, for shift locking the keys or for coding the keys. Preferably these circuits are designed as low power circuits and can be operated by energy from the crystal element only, i.e. by the converted pressure energy, to keep the keyboard powerless at rest. In order to assure operation even if the keys are seldom activated, charge storing capacities can be provided for on the keyboard, e.g. by laminates 1, 2 themselves, which can be coated to form a plate condenser. Even a low power display, such as a liquid crystal display, can be fed directly by the keyboard.

The crystal elements are preferably electrically contacted by way of conducting layers, which are provided on one or both of laminates 1, 2, e.g. by a printing process, such as screen printing, or by glueing conducting layers to the laminate. In FIG. 1 a conducting strip 4 is shown, which interconnects the surfaces adjacent to laminate 1 of the three crystal elements 6a, 6b and 6c. Thus a common electrical connection is provided for the keys. Separate conducting strips 5, each leading to one of the connection contacts 7 on the other side of each crystal element 6a, 6b, 6c, are provided for on the surface of laminate 2 adjacent to laminate 3. These strips 5 thus form an individual electrical connection to each key. Although a keyboard with only three keys is shown, keyboards according to the invention may consist of only a single key or of arrays with many keys in any usual electrical connection. The conducting strips 4, 5 can be accessible at one or several edges of the keyboard or the strips—as shown e.g. with strip 4—can be led away on a tab which can be provided with a special connector (not shown) at its end.

Figure 2:
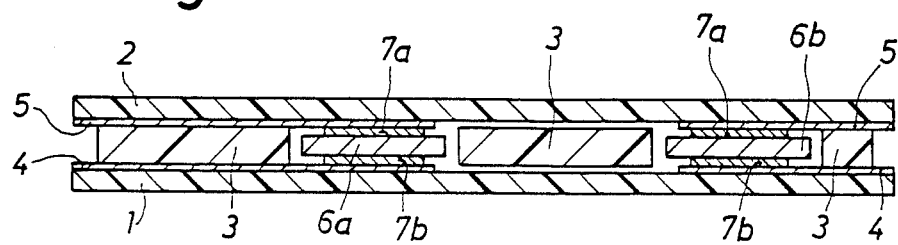
FIG. 2 is a longitudinal section view of an embodiment similar to that of FIG. 1.

FIG. 2 shows a sectional view of a laminated keyboard with two key crystal elements 6a, 6b. The support laminate is again designated with 1 and the cover laminate with 2. The in-between laminate 3 is provided with the mentioned recesses for crystal elements 6a, 6b and has a thickness corresponding essentially to the thickness of a crystal element including the connection contacts 7a, 7b. The connection contacts 7a, 7b of each crystal element comprise of conducting material which is applied to the charge carrying surfaces of the crystal by known methods such as evaporation, sputtering, printing or pasting with a conducting adhesive. The connection contacts make contact to the conducting strips 4 and 5, respectively, on corresponding laminates 1 and 2. An imprint or an imprinted sheet may be put on the cover laminate to mark the key areas for the user of the keyboard. A mechanical element (not shown) can be provided below laminate 1 for each key, which provides a pressure feedback point to the otherwise travelless keys. This mechanical element may also provide an audible "click" acknowledging actuation of a key.

Since the piezoelectric effect is reversible (electrostrictive effect) acknowledging is made easy with the inventive keyboard by feeding alternative current to the respective crystal element. Thus the user can be informed by a pulsing or oscillating of the crystal—depending on the frequency of the AC-voltage—which can be felt or heard.

Figure 3:
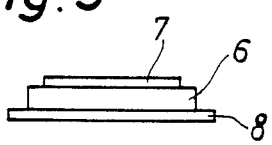
FIG. 3 is a side view of a crystal element.

FIG. 3 shows a side view of a special crystal element. The crystal 6 is provided on one side with a connection contact 7 as already mentioned (shown with increased thickness for better representation in the drawing). On the opposite side a rigid metal disc or plate 8 is provided serving as second connection contact (7b in FIG. 2). The rigid disc forms a suitable base when pressure is applied on the crystal 6, especially if laminate 1 is very thin and thus the support very flexible.

Figure 4:
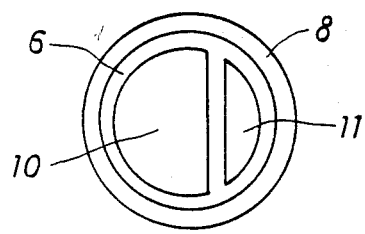
FIG. 4 is a top view of another crystal.

In FIG. 4 another crystal element with a rigid plate 8 on the lower side is shown in top view. The upper connection contact of this element 6 is divided into two electrically separated zones 10 and 11. If the zones 10 and 11 are of different size, a pressure signal voltage is not only generated between connection contacts 10 and 8 and also 11 and 8 but between zones 10 and 11 as well. It is therefore possible with this element either to contact only zones 10 and 11 necessitating conducting strips only on one of the laminates or to pick off different signal voltages.

Another type of crystal element may also be provided which does not generate a signal when pressure is applied but which alters an applied electrical signal when pressure is applied. For example an oscillating piezocrystal element which changes its oscillating frequency under pressure or a piezotransistor which changes collector current or current amplification.

As shown in FIGS. 2, 5, 6 and 7 the recess in laminate 3 for the respective crystal element has a greater diameter than the element itself. Thus, the element is laterally displaceable by a certain amount; it is "slidably" mounted between support laminate 1 and cover laminate 2. This allows slight lateral movements when the flexible keyboard is bent and makes possible the thin laminated construction without danger of crystal fracture.

Laminate 3 should be as incompressible as possible to avoid cross-talk between keys. Laminate 3 further prevents contact of conducting strips 4 and 5 and edge seals the keyboard against adverse ambient conditions.

Figure 5:
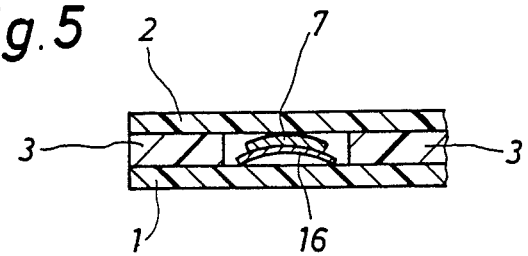
FIG. 5 is a sectional view of an embodiment of the keyboard with a convex crystal element.

FIG. 5 shows schematically a sectional view of another embodiment. 1, 2 and 3 designate again support laminate, cover laminate and in between laminate. Conducting strips 4 and 5 are not shown in this figure (as well as in FIGS. 6 and 7), but the elements are preferably electrically interconnected by such strips as mentioned above. In this embodiment the crystal element is dish-shaped which increases mechanical stress in the element under pressure and thus output voltage.

Figure 6:
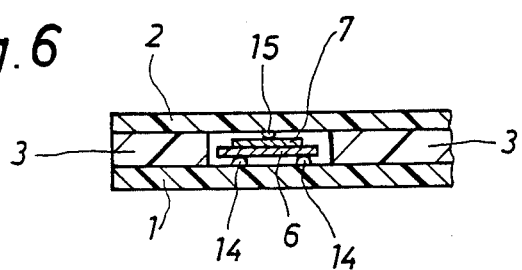
FIG. 6 is a sectional view of another embodiment of the keyboard.

FIG. 6 shows another embodiment, wherein the stress on a flat crystal element 6 is increased by supporting the element on projections 14, which results in an increased deflection of the element. Projections 14 can be applied to on the support laminate by a printing process or with an adhesive. The projections may also be part of the conducting strips and at the same time contact the element 6. A projection 15 can be provided on the cover laminate 2, concentrating the pressure from the operator's finger to the center of the element. This projection may also be part of a conducting strip.

Figure 7:
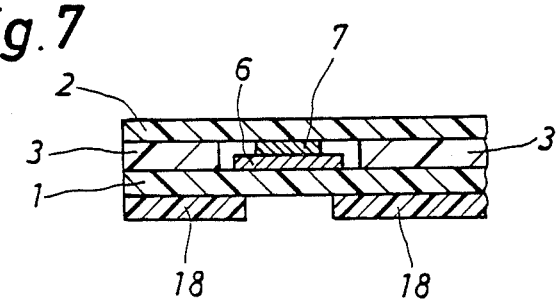
FIG. 7 is a sectional view of still another embodiment.

FIG. 7 shows another embodiment, wherein deflection of the crystal element 6 is promoted by another laminate or plate 18 arranged below support laminate 1 and having a recess below the center of element 6.

While the invention has been particularly shown and described with reference to preferred embodiments thereof, it will be understood by those skilled in the art that various changes in form and details may be made therein without departing from the spirit and scope of the invention.

I claim:

1. Keyboard having a plurality of key locations comprising:
    a support layer;
    an intermediate laminate;
    a cover laminate;
    a plurality of piezoelectric crystal elements, each of said crystal elements being arranged at one of said key locations for generating an electrical signal upon a pressure acting thereon;
    supporting means for each of said crystal elements;
    wherein each of said crystal elements has electric contact areas at upper and lower surfaces of said crystal elements, one of said contact areas being a substantially rigid plate;
    wherein said supporting means are provided to support the respective crystal element substantially along its periphery to allow the crystal element to flex upon loading at its center area;
    wherein said cover laminate has a thickness to allow pressure transmission to a crystal element therebelow at a key location almost without travel;
    wherein said intermediate laminate is made of incompressible material and has an opening at each of said key location for receiving one of said crystal elements, each of said crystal elements, together with its electric contact areas, having a thickness which substantially corresponds to a thickness of the intermediate laminate, so as to provide a flat surface of substantially uniform thickness and to prevent forces applied to a key location from being transmitted to crystal elements at adjacent key locations; and
    wherein said cover laminate, said intermediate laminate and said support layer are glued to each other except at the crystal elements to form a single body providing a closed casing for each of said crystal elements.

2. A keyboard according to claim 1, wherein said opening for said crystal element in said intermediate laminate has a slightly greater diameter than a diameter of said crystal element.

3. A keyboard according to claim 1, wherein said crystal element is dish-shaped.

4. A keyboard according to claim 1, wherein said cover laminate includes an elevated area arranged opposite to a center of said crystal element.

5. A keyboard according to claim 1, further comprising at least one of a plate and a laminate provided below said support layer, and having a recess being essentially concentric to said crystal element with a diameter smaller than a diameter of said crystal element.

6. A keyboard according to claim 1, wherein said intermediate laminate has a thickness of approximately 0.4 mm.

7. A keyboard according to claim 1, wherein said crystal element is fixed to an underlying, rigid metal plate providing said lower contact area.

8. Keyboard according to claim 1, wherein said support layer and said cover laminate have inner surfaces and conducting strips at said inner surfaces for electrically connecting said electric contact areas of said crystal elements.

9. Keyboard according to claim 8, wherein said conducting strips on said cover laminate are provided with a projection at a center area of each key location, said projections being part of said conducting strips of said cover laminate and each having a lateral extension, which is substantially smaller than the extension of said upper surface of said crystal element, and wherein the upper surface of each crystal element at its contact area is mechanically and electrically contacted by said projection only.

10. Keyboard according to claim 9, wherein said supporting means provided at said support layer are formed by projections extending upwards from said support layer such as to contact said lower surface of each crystal element only along its periphery, said projections being part of said conductive strips of said support layer.

* * * * *